United States Patent
Hsiao et al.

(10) Patent No.: US 6,808,987 B2
(45) Date of Patent: Oct. 26, 2004

(54) VERTICAL NITRIDE READ-ONLY MEMORY CELL AND METHOD FOR FORMING THE SAME

(75) Inventors: Ching-Nan Hsiao, Kaohsiung (TW); Ying-Cheng Chuang, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/460,796

(22) Filed: Jun. 12, 2003

(65) Prior Publication Data

US 2004/0180496 A1 Sep. 16, 2004

(30) Foreign Application Priority Data

Mar. 14, 2003 (TW) .......................... 92105586 A

(51) Int. Cl.[7] .......................................... H01L 21/336
(52) U.S. Cl. .................. 438/257; 438/206; 257/314
(58) Field of Search .......................... 438/257, 243, 438/386, 389; 257/390

(56) References Cited

U.S. PATENT DOCUMENTS

| | | | | |
|---|---|---|---|---|
| 6,207,515 B1 | * | 3/2001 | Hsieh et al. ................. | 438/300 |
| 6,504,200 B2 | * | 1/2003 | Schlosser et al. ........... | 257/301 |
| 6,525,363 B1 | * | 2/2003 | Willer et al. ................. | 257/309 |
| 6,583,479 B1 | * | 6/2003 | Fastow et al. ............... | 257/390 |
| 2003/0068845 A1 | * | 4/2003 | Chen et al. .................. | 438/197 |

* cited by examiner

Primary Examiner—Hoai Ho
Assistant Examiner—Thao P. Le
(74) Attorney, Agent, or Firm—Quintero Law Office

(57) ABSTRACT

A method for forming a vertical nitride read-only memory cell. A substrate having at least one trench is provided. A first conductive layer is formed in the lower trench and insulated from the substrate to serve as a source line. A first doping region is formed in the substrate adjacent to the top of the first conductive layer. A first insulating layer is formed on the first conductive layer. A second doping region is formed in the substrate adjacent to the top of the trench. A second insulating layer is formed over the sidewall of the trench and on the first insulating layer to serve as a gate dielectric layer. A second conductive layer is formed in the upper trench to serve as a control gate. A vertical nitride read-only memory cell is also disclosed.

17 Claims, 6 Drawing Sheets

VERTICAL NITRIDE READ-ONLY MEMORY CELL AND METHOD FOR FORMING THE SAME

BACKGROUND OF THE INVENTION

1. Field of the Invention

The present invention relates in general to a method for forming a non-volatile memory cell. More particularly, it relates to a method for forming a vertical nitride read-only memory (NROM) cell.

2. Description of the Related Art

The non-volatile memory industry began development of nitride read-only memory (NROM) in 1996. This relatively new non-volatile memory technology utilizes oxide-nitride-oxide (ONO) gate dielectric and known mechanisms of program and erase to create two separate bits per cell. Thus, the NROM bit size is half of the cell area. Since silicon die size is the main element in the cost structure, it is apparent why the NROM technology is an economic breakthrough.

FIG. 1 is a cross-section showing a conventional NROM cell structure. This cell includes a silicon substrate 100 which has two separated bit lines (source and drain) 102, two bit line oxides 104 formed over each of the bit lines 102, respectively, and an ONO layer 112 having a silicon nitride layer 108 sandwiched between the bottom silicon oxide layer 106 and the top silicon oxide layer 110 formed on the substrate 100 between the bit line oxides 102. A gate conductive layer 114 (word line) lies on the top of the bit line oxides 104 and the ONO layer 112.

The silicon nitride layer 108 in the ONO structure 112 has two chargeable areas 107 and 109 adjacent to the bit lines 102. These areas 107 and 109 are used for storing charges during memory cell programming. To program the left bit close to area 107, left bit line 102 is the drain and receives the high programming voltage. At the same time, right bit line 102 is the source and is grounded. The opposite is true for programming area 109. Moreover, each bit is read in a direction opposite its programming direction. To read the left bit, stored in area 107, left bit line 102 is the source and right bit line 102 is the drain. The opposite is true for reading the right bit, stored in area 109. In addition, the bits are erased in the same direction that they are programmed.

Increasing cell density for integration of ICs requires shrinking the width of the ONO layer. Unfortunately, shrinking the gate length (the width of the ONO layer) may induce cell disturbance during programming, erasing, or reading, in particular, when width of the gate length is less than 10 nm. Therefore, the cell density is limited.

SUMMARY OF THE INVENTION

Accordingly, an object of the present invention is to provide a novel method for forming a vertical nitride read-only memory (NROM) cell, which uses the formation of a vertical channel instead of the conventional planar one, thereby preventing cell disturbance during programming, erasing, and reading.

According to the object of the invention, the invention provides a vertical NROM cell, which includes a substrate, a source line, a first doping region, an insulating layer, a second doping region, a gate dielectric layer, and a control gate. The substrate has at least one trench. The source line is disposed in the lower trench and insulated from the substrate. The first doping region is formed in the substrate adjacent to the top of the source line and the second doping region is formed in the substrate adjacent to the top of the trench. The insulating layer is disposed on the source line. The control gate is disposed in the upper trench and insulated from the substrate by the gate dielectric layer disposed over the sidewall of the trench and on the insulating layer.

Moreover, the source line and control gate can be doped polysilicon layers. The gate dielectric layer can be an oxide-nitride-oxide (ONO) layer.

Additionally according to the object of the invention, the invention provides a method for forming a vertical NROM cell. First, a substrate having at least one trench is provided. Next, a first conductive layer is formed in the lower trench and insulated from the substrate to serve as a source line. A doped insulating layer is then formed over the sidewall of the middle trench and on the first conductive layer, and then a drive-in treatment is performed on the doped insulating layer to form a first doping region in the substrate adjacent to the top of the first conductive layer. Thereafter, the doped insulating layer is removed. Next, a first insulating layer is formed on the first conductive layer. Next, a second doping region is formed in the substrate adjacent to the top of the trench. Next, a second insulating layer is formed over the sidewall of the trench and on the first insulating layer to serve as a gate dielectric layer. Finally, a second conductive layer is formed in the upper trench to serve as a control gate.

Additionally, the first and second conductive layers can be doped polysilicon layers.

The doped insulating layer can be an arsenic silicate glass (ASG) layer and has a thickness of about 100–200 Å. The drive-in treatment can be performed at 900–1100° C. for 20–40 min.

Moreover, the first insulating layer can be a silicon oxide layer and the second insulating layer can be an oxide-nitride-oxide layer.

DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1:
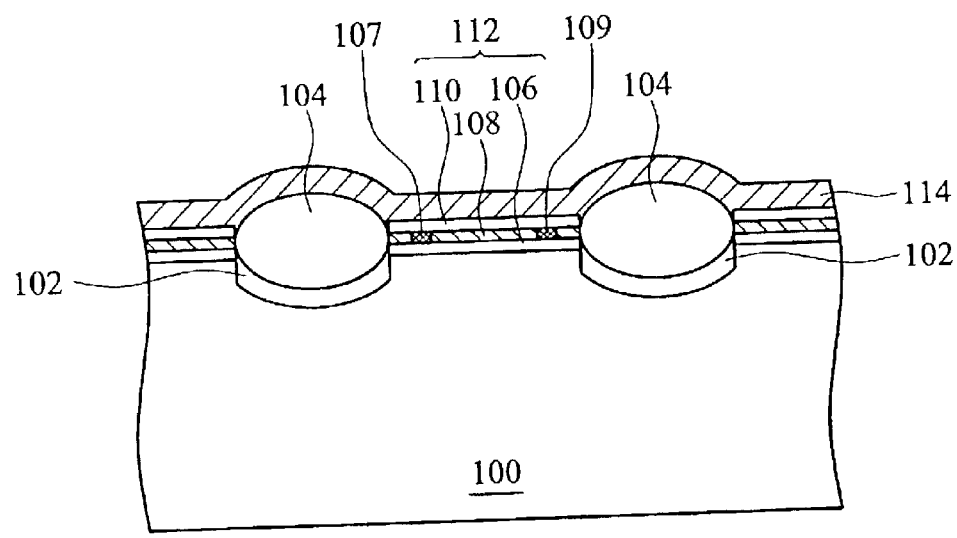
FIG. 1 is a cross-section showing a conventional NROM cell structure.
Figure 2A:
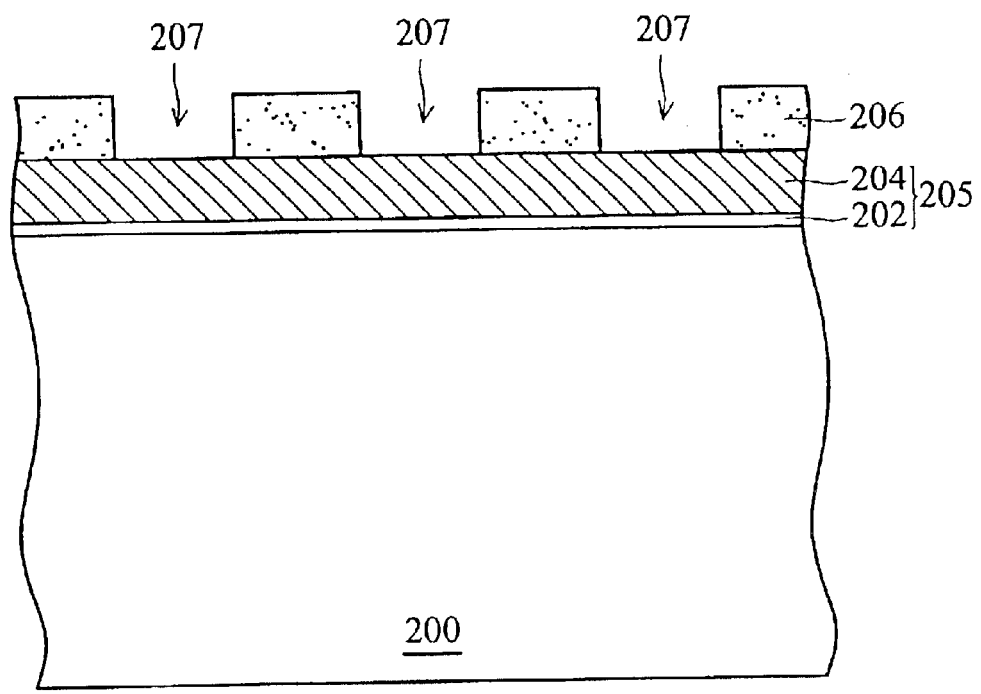
FIGS. 2a to 2i are cross-sections showing a method flow for forming a vertical NROM cell according to the present invention.

A preferred embodiment of the present invention is now described with reference to FIGS. 2a to 2i. First, in FIG. 2a, a substrate 200, such as a silicon substrate, is provided. A mask layer 205 is formed on the substrate 200. As shown in FIG. 2a, the mask layer 205 can be composed of a pad oxide layer 202 and a thicker overlying silicon nitride layer 204. In this invention, the pad oxide layer 202 has a thickness of about 100 Å and can be formed by thermal oxidation or conventional CVD, such as atmospheric pressure CVD (APCVD) or low pressure CVD (LPCVD). Moreover, the silicon nitride layer 204 overlying the pad oxide layer 202 has a thickness of about 1000–2000 Å and can be formed by LPCVD using $SiCl_2H_2$ and $NH_3$ as reaction source.

Next, a photoresist layer 206 is coated on the mask layer 205, and then the photoresist layer 206 is patterned by lithography to form a plurality of openings 207 therein.

Figure 2B:
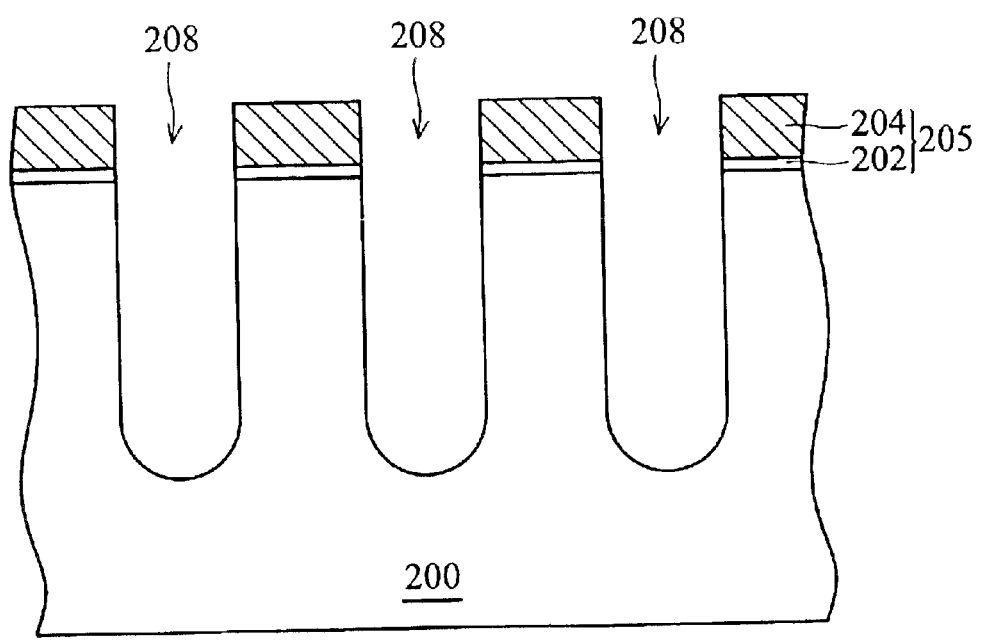

Next, in FIG. 2b, the mask layer 205 is anisotropically etched by, for example, reactive ion etching (RIE), using the patterned photoresist layer 206 as an etch mask to transfer the opening patterns 207 to the mask layer 205. Thereafter, the photoresist layer 206 is removed by a suitable wet etching or ashing technique.

Anisotropic etching, for example, RIE, is subsequently performed using the mask layer 205 as an etch mask. The silicon substrate 200 under these openings is etched to form a plurality of trenches 208 in the silicon substrate 200.

Figure 2C:
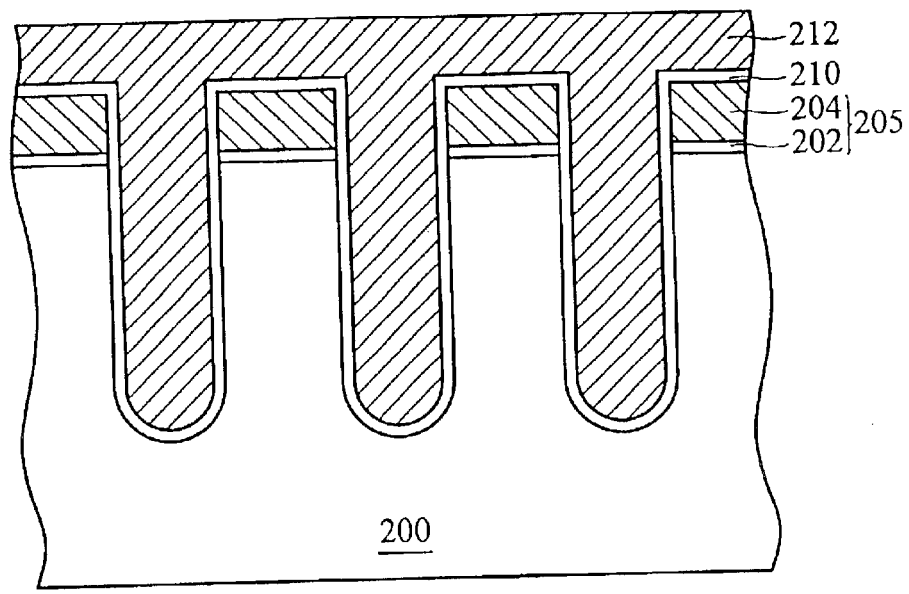

Next, in FIG. 2c, a thin silicon oxide layer 210 is conformably formed on the masking layer 205 and on the inner surface of the trenches 208 by CVD. The silicon oxide layer 210 has a thickness of about 30–100 Å and is used for repairing the defects (not shown) in the substrate 200 formed during etching the trenches 208. Next, a conductive layer, such as a doped polysilicon layer, 212 is deposited on the thin silicon oxide layer 210 and fills in the trenches 208.

Figure 2D:
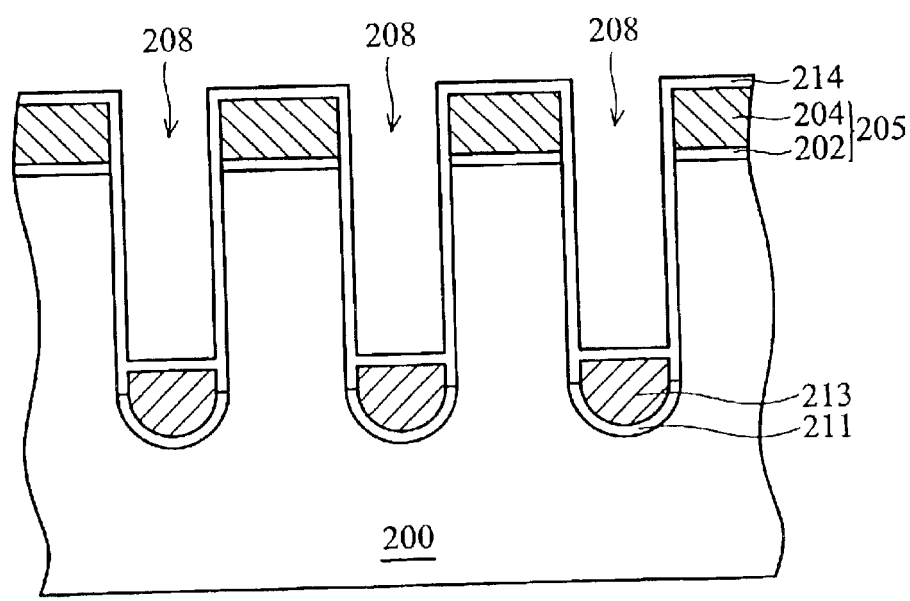

Next, in FIG. 2d, the conductive layer 212 is etched back by dry etching, such as RIE, to leave a portion of conductive layer 213 in each lower trench 208 to serve as a source line. The remaining conductive layer 213 has a height of about 1000 Å. Thereafter, the thin silicon oxide layer 210 is etched with diluted hydrofluoric acid (DHF) or a buffer oxide etching (BOE) solution using the source line 213 as a mask to leave a portion of silicon oxide layer 211 to serve as an insulating layer between the source line 213 and the substrate 200. Next, a doped insulating layer 214 is conformably formed on the masking layer 205 and on the inner surface of the trench 208 where a source line 213 is formed. In the invention, the doped insulated layer 214 can be an arsenic silicate glass (ASG) layer and has a thickness of about 100–200 Å.

Figure 2E:
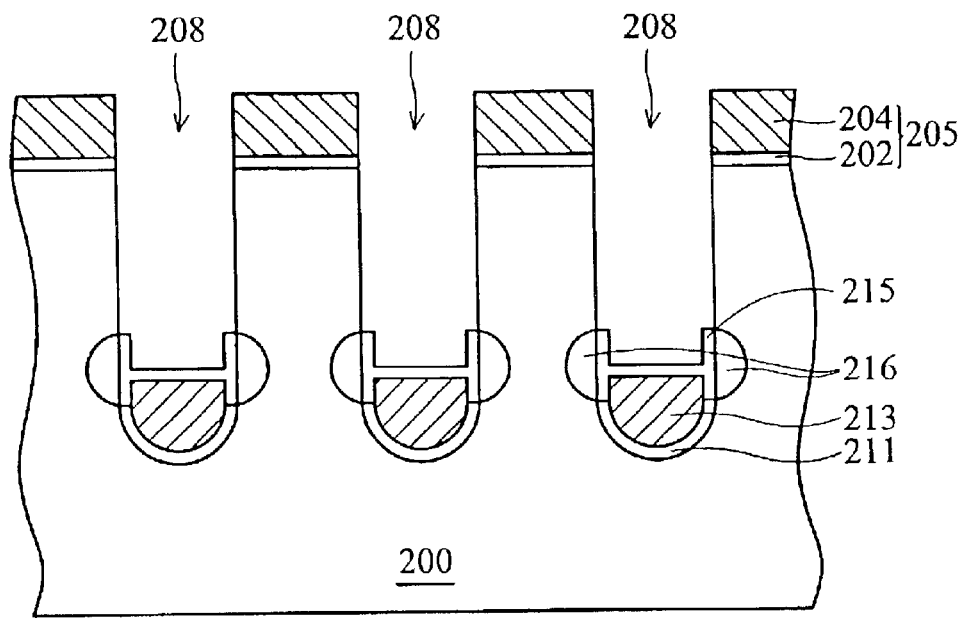

Next, in FIG. 2e, a photoresist layer (not shown) having a thickness of about 300 Å is filled in each trench 208. The doped insulating layer 214 is etched by DHF or BOE using the photoresist layer as a mask to leave a portion of the doped insulating layer 215 over the sidewall of the middle trench 208 and on the source line 213. A drive-in treatment is subsequently performed on the remaining doped insulating layer 215 to form a doping region 216 in the substrate 200 adjacent to the top of the source line 213. In the invention, the drive-in treatment is performed at 900–1100° C. for 20–40 min.

Figure 2F:
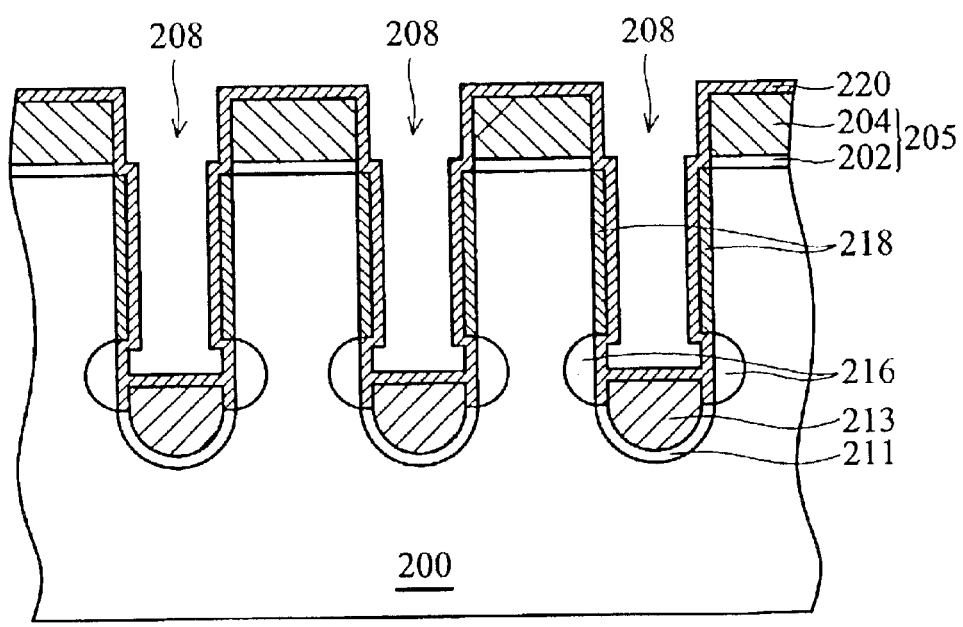

Next, in FIG. 2F, a silicon nitride spacer 218 is formed over the exposed substrate 200 above the remaining doped insulating layer 215. The silicon nitride spacer 218 can be formed by thermal nitridation using $N_2$, $NH_3$, or the mixture of $N_2$ and $NH_3$ as a process gas. Next, the remaining doped insulating layer 215 is removed by wet chemical etching. Thereafter, a thin conductive layer 220 is formed on the masking layer 205 and on the inner surface of the trench 208 having the silicon nitride spacer 218 and the source line 213 by the conventional deposition, such as CVD. The thin conductive layer 220 can be a doped polysilicon layer and has a thickness of about 150 Å.

Figure 2G:
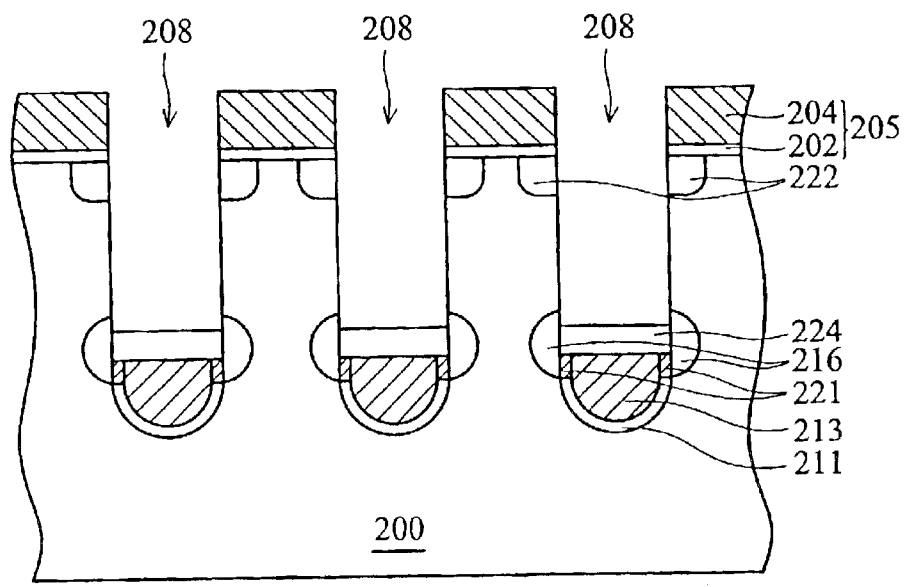

Next, in FIG. 2g, the thin conductive layer 220 is etched by wet chemical etching to leave a portion of the thin conductive layer 221 on the remaining thin silicon oxide layer 211. Here, the remaining thin conductive layer 221 serves as an electrical connecting layer between the source line 213 and the doping region 216. Next, an insulating layer 224 is formed on the thin conductive layer 221 and the source line 213 for the isolation of the source line 213. In the invention, the insulating layer 224 can be a silicon oxide layer and have a thickness of about 300–500 Å. Next, another doping region 222 is formed in the substrate 200 adjacent to the top of the trench 208 by the conventional tilted ion implantation to serve as a drain region.

Figure 2H:
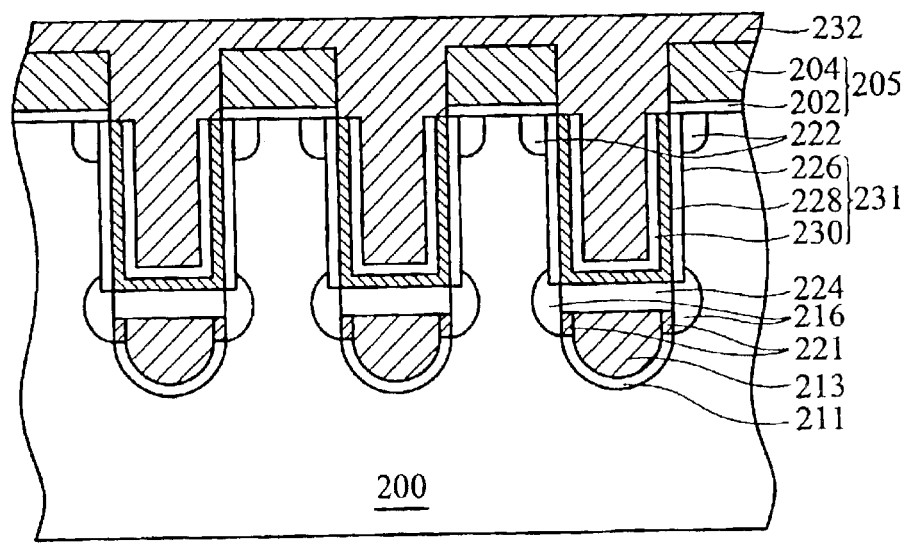

Next, in FIG. 2h, an insulating layer 231 is formed over the sidewall of the trench 208 and on the insulating layer 216 to serve as a gate dielectric layer. In the invention, the insulating layer 231 can be an oxide-nitride-oxide (ONO) layer composed of a silicon oxide layer 226, a silicon nitride layer 228, and a silicon oxide layer 230. The nitride layer 228 and the silicon oxide layers 226 and 230 have a thickness of about 30–100 Å, respectively. Moreover, the silicon oxide layer 226 can be formed by thermal oxidation. The silicon nitride layer 228 and the silicon oxide layer 230 can be respectively formed by CVD. As mentioned above, the silicon nitride layer 228 in the ONO layer 231 is used for storing charges during memory cell programming.

In the invention, the substrate 200 in the sidewall of the trench 208 is used as the channel of the memory cell which differs from the conventional planar channel. That is, a vertical channel can be formed according to the method for forming a NROM cell of the invention.

Next, a conductive layer 232 is formed on the masking layer 205 and completely fills in the upper trench 208 to serve as a control gate. The conductive layer 232 can be a doped polysilicon layer. Subsequently, a planarization process, such as chemical mechanical polishing (CMP), can be optionally performed to the conductive layer 232 which is useful for subsequent processes.

Figure 2I:
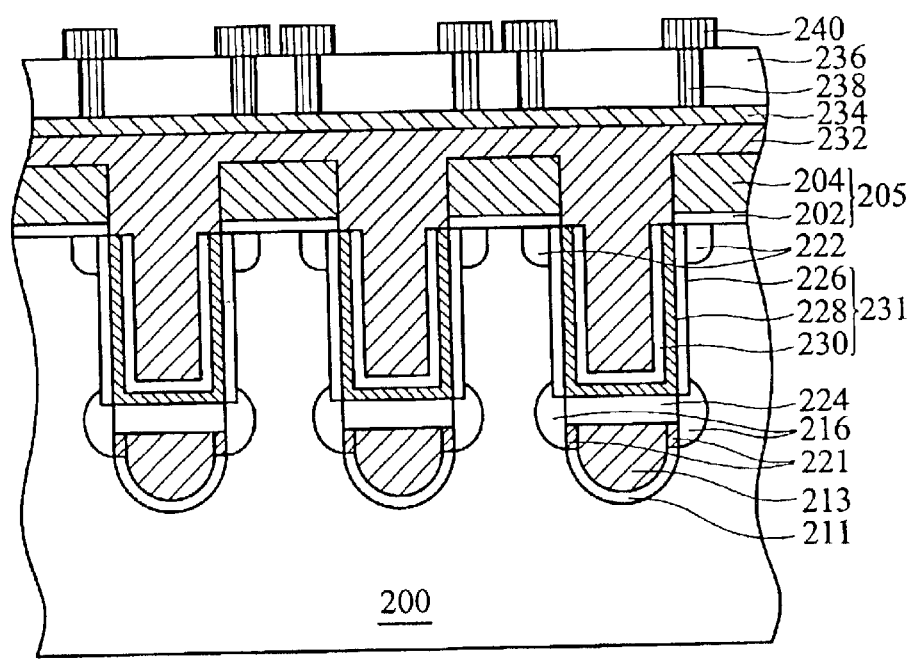

Finally, in FIG. 2i, a cap layer 234 and an interlayer dielectric (ILD) layer 236 are successively formed on the conductive layer 232 by the conventional deposition, such as CVD. In the invention, the cap layer 234 is used for protecting the conductive layer 232 and can be a silicon nitride layer. Moreover, the ILD layer 236 can be a borophosphorous silicate glass (BPSG) layer, a tetraethyl orthosilicate (TEOS) oxide layer, or a spin on glass (SOG) layer. A plurality of via holes are then formed in the ILD layer 236 over the doping region 222 by the conventional lithography and etching, and the via hole is then filled with metal, such as tungsten, aluminum, or copper, to form a metal plug 238. A metal layer (not shown), such as aluminum or copper, is formed on the ILD layer 236 and on the metal plugs 238. Subsequently, the metal layer is patterned by the conventional lithography and etching to form patterned metal layer 240 to serve as a bit line.

Also, FIG. 2h is a cross-section showing an NROM cell structure according to the invention. The cell includes a substrate having at least one trench 208, a source line 213, doping regions 216 and 222, an insulating layer 224, a gate dielectric layer 231, and a control gate 232. The source line 231, which can be a doped polysilicon layer, is disposed in the lower trench 208 and insulated from the substrate 200 by a thin silicon oxide layer 211. The doping region 216 is formed in the substrate adjacent to the top of the source line 213 to serve as a source region, and the doping region 222 is formed in the substrate 200 adjacent to the top of the trench 208 to serve as a drain region. The insulating layer 224, which can be a silicon oxide layer, is disposed on the source line 213. The gate dielectric layer 231, which can be an ONO layer composed of a silicon oxide layer 226, a silicon nitride layer 228, and a silicon oxide layer 230, is disposed over the sidewall of the trench 208 and on the insulating layer 224. The control gate 232, which can be a doped polysilicon layer, is disposed in the upper trench 208.

Compared with the prior art, the NROM cell of the invention has a vertical channel with a suitable channel length, thereby preventing cell disturbance. The channel length is based on the depth of the trench. Accordingly, cell disturbance can be avoided when the depth of the trench is sufficiently deep. Moreover, since the vertical channel can reduce the used area on a substrate, the density of the devices can be increased. Accordingly, the method for forming a NROM cell according to the invention can increase the integration and the memory cell performance.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a vertical nitride read-only memory cell, comprising the steps of:

providing a substrate having at least one trench;

forming a first conductive layer in the lower trench and insulated from the substrate to serve as a source line;

forming a first doping region in the substrate adjacent to the top of the first conductive layer;

forming a first insulating layer on the first conductive layer;

forming a second doping region in the substrate adjacent to the top of the trench;

forming a second insulating layer over the sidewall of the trench and on the first insulating layer to serve as a gate dielectric layer; and forming a second conductive layer in the upper trench to serve as a control gate.

2. The method as claimed in claim 1, wherein the substrate is a silicon substrate.

3. The method as claimed in claim 1, wherein the first conductive layer is a doped polysilicon layer.

4. The method as claimed in claim 1, wherein the step of forming the first doping region comprises the steps of:

forming a doped insulating layer over the sidewall of the middle trench and on the first insulating layer;

performing a drive-in treatment on the doped insulating layer to form the first doping region in the substrate adjacent to the top of the first conductive layer; and removing the doped insulating layer.

5. The method as claimed in claim 4, wherein the doped insulating layer is an arsenic silicate glass layer and has a thickness of about 100–200 Å.

6. The method as claimed in claim 4, wherein the drive-in treatment is performed at 900–1100° C.

7. The method as claimed in claim 4, wherein the drive-in treatment is performed for 20–40 min.

8. The method as claimed in claim 1, wherein the first insulating layer is a silicon oxide layer.

9. The method as claimed in claim 1, wherein the second doping region is formed by tilted ion implantation.

10. The method as claimed in claim 1, wherein the second insulating layer is an oxide-nitride-oxide layer.

11. The method as claimed in claim 1, wherein the second conductive layer is a doped polysilicon layer.

12. A vertical nitride read-only memory cell, comprising:

a substrate having at least one trench;

a source line disposed in the lower trench and insulated from the substrate;

a first doping region formed in the substrate adjacent to the top of the source line;

an insulating layer disposed on the source line;

a second doping line formed in the substrate adjacent to the top of the trench;

a gate dielectric layer disposed over the sidewall of the trench and on the insulating layer; and a control gate disposed in the upper trench.

13. The cell as claimed in claim 12, wherein the substrate is a silicon substrate.

14. The cell as claimed in claim 12, wherein the source line is a doped silicon layer.

15. The cell as claimed in claim 12, wherein the insulating layer is a silicon oxide layer.

16. The cell as claimed in claim 12, wherein the gate dielectric layer is an oxide-nitride-oxide layer.

17. The cell as claimed in claim 12, wherein the control gate is a doped polysilicon layer.

* * * * *